US009097932B2

(12) United States Patent
Kim et al.

(10) Patent No.: US 9,097,932 B2
(45) Date of Patent: Aug. 4, 2015

(54) LIQUID CRYSTAL DISPLAY DEVICE AND METHOD OF MANUFACTURING THE SAME

(71) Applicant: SAMSUNG DISPLAY CO., LTD, Yongin-si, Gyeonggi-do (KR)

(72) Inventors: Do-Hoon Kim, Yongin-si (KR); Dong-Kyu Kim, Yongin-si (KR)

(73) Assignee: Samsung Display Co., Ltd, Yongin-si (KR)

( * ) Notice: Subject to any disclaimer, the term of this patent is extended or adjusted under 35 U.S.C. 154(b) by 206 days.

(21) Appl. No.: 13/733,841

(22) Filed: Jan. 3, 2013

(65) Prior Publication Data

US 2014/0071368 A1    Mar. 13, 2014

(30) Foreign Application Priority Data

Aug. 2, 2012 (KR) .................. 10-2012-0084991

(51) Int. Cl.
| | |
|---|---|
| *G02F 1/1333* | (2006.01) |
| *G02F 1/1335* | (2006.01) |
| *H01L 33/58* | (2010.01) |
| *G02F 1/1339* | (2006.01) |

(52) U.S. Cl.
CPC .... *G02F 1/133514* (2013.01); *G02F 1/133512* (2013.01); *G02F 1/133516* (2013.01); *H01L 33/58* (2013.01); *G02F 1/1339* (2013.01); *G02F 2201/086* (2013.01)

(58) Field of Classification Search
CPC ................... G02F 1/133514; G02F 1/133516; H01L 33/58
USPC .................. 349/44, 43, 46, 106, 39; 313/500; 438/30
See application file for complete search history.

(56) References Cited

U.S. PATENT DOCUMENTS

| | | | | |
|---|---|---|---|---|
| 2002/0149729 A1* | 10/2002 | Nishimura et al. | ............ | 349/141 |
| 2002/0159016 A1* | 10/2002 | Nishida et al. | ................. | 349/141 |
| 2004/0075380 A1* | 4/2004 | Takemoto et al. | ............. | 313/500 |
| 2004/0135941 A1* | 7/2004 | Nam et al. | ..................... | 349/110 |
| 2005/0190335 A1* | 9/2005 | Maruyama et al. | ........... | 349/153 |
| 2006/0164582 A1 | 7/2006 | Kim et al. | | |
| 2007/0080346 A1* | 4/2007 | Kim et al. | ....................... | 257/40 |
| 2008/0284720 A1* | 11/2008 | Fukutome | ..................... | 345/102 |
| 2009/0167975 A1* | 7/2009 | Lee et al. | ......................... | 349/43 |
| 2011/0019144 A1* | 1/2011 | Koh et al. | ...................... | 349/143 |
| 2012/0113343 A1* | 5/2012 | Konno et al. | .................. | 349/39 |

FOREIGN PATENT DOCUMENTS

| | | |
|---|---|---|
| JP | 2003-332046 | 11/2003 |
| JP | 2007-141863 A | 6/2007 |
| KR | 10-2006-0086176 | 7/2006 |

* cited by examiner

*Primary Examiner* — Sang V Nguyen
(74) *Attorney, Agent, or Firm* — Christie, Paker & Hale, LLP (57) ABSTRACT

A liquid crystal display device and a method of manufacturing the liquid crystal display device are provided. The liquid crystal display device includes: a first substrate, a second substrate opposing the first substrate, an interconnection portion on the first substrate, an ultraviolet light blocking portion adjacent to both sides of the interconnection portion, an organic film on the first substrate and covering the interconnection portion and the ultraviolet light blocking portion, a liquid crystal layer between the organic film and the second substrate, and a sealing member overlapping the interconnection portion and surrounding the liquid crystal layer between the organic film and the second substrate. The liquid crystal display device reduces or minimizes organic film defects caused by radiating ultraviolet light to form the sealing member.

19 Claims, 4 Drawing Sheets

LIQUID CRYSTAL DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-0084991, filed on Aug. 2, 2012 in the Korean Intellectual Property Office, the entire content of which is incorporated herein by reference.

BACKGROUND

1. Field

Aspects of embodiments of the present invention relate to a liquid crystal display device and a method of manufacturing the liquid crystal display device.

2. Description of the Related Art

Recently, large volume display devices such as cathode ray tube display devices have been substituted by thin flat display devices that are more portable. Among the flat display devices, liquid crystal display devices have low power consumption and generate few electromagnetic waves. Accordingly, liquid crystal display devices are considered when selecting next generation display panels.

An example liquid crystal display device is fabricated by injecting liquid crystals between two substrates and joining the two substrates to each other by using a sealing member. The sealing member is hardened, for example, by a light source such as ultraviolet light. However, organic film located around the sealing member may be damaged by such ultraviolet light. That is, a contiguous structure of the organic film may be broken by the ultraviolet radiation, thereby increasing the inflow of external moisture into the liquid crystal display device, which can lead to problems such as stains being formed on a screen of the display device.

SUMMARY

Embodiments of the present invention provide for a liquid crystal display device that lessens or minimizes organic film defects. Further embodiments of the present invention also provide for a method of manufacturing the liquid crystal display device.

According to an exemplary embodiment of the present invention, a liquid crystal display device is provided. The liquid crystal display device includes a first substrate, a second substrate opposing the first substrate, an interconnection portion on the first substrate, an ultraviolet light blocking portion adjacent to both sides of the interconnection portion, an organic film on the first substrate and covering the interconnection portion and the ultraviolet light blocking portion, a liquid crystal layer between the organic film and the second substrate, and a sealing member overlapping the interconnection portion and surrounding the liquid crystal layer between the organic film and the second substrate.

The liquid crystal display device may further include a capacitor portion on the first substrate. The capacitor portion may include a first storage electrode including a light transmissive electrode layer formed from a same layer as the ultraviolet light blocking portion.

The ultraviolet light blocking portion may include a same material as the first storage electrode.

The ultraviolet light blocking portion may have a haze value larger than that of the first storage electrode.

The liquid crystal display device may further include a thin film transistor portion on the first substrate and electrically connected to the interconnection portion.

The thin film transistor portion may include a gate electrode including a same material and formed from a same layer as the interconnection portion, a gate insulating layer on the gate electrode, an active layer on the gate insulating layer, and a source electrode and a drain electrode connected to the active layer.

The gate insulating layer may extend onto the first storage electrode. The capacitor portion may further include a second storage electrode on the gate insulating layer. The second storage electrode may include a same material as the source electrode and the drain electrode.

The liquid crystal display device may further include a first pixel electrode on the organic film. The first pixel electrode may be connected to the drain electrode and the second storage electrode through via holes in the organic film.

The liquid crystal display device may further include a protection layer on the source electrode and the drain electrode. The gate insulating layer and the protection layer may extend to cover the interconnection portion and the ultraviolet light blocking portion.

According to another exemplary embodiment of the present invention, a liquid crystal display device is provided. The liquid crystal display device includes: a first substrate; an interconnection portion, an ultraviolet light blocking portion, a thin film transistor portion, and a capacitor portion on the first substrate; an organic film on the first substrate and covering the interconnection portion, the ultraviolet light blocking portion, the thin film transistor portion, and the capacitor portion; and a sealing member on the organic film. The capacitor portion includes a first storage electrode including a light transmissive material formed from a same layer as the ultraviolet light blocking portion. The ultraviolet light blocking portion includes a same material as the first storage electrode and is adjacent to and outside of an overlap region of the first substrate and an outer wall of the sealing member.

The ultraviolet light blocking portion may be adjacent to both sides of the interconnection portion. The interconnection portion may overlap the sealing member.

The ultraviolet light blocking portion may have a haze value larger than that of the first storage electrode.

The liquid crystal display device may further include a second substrate opposing the first substrate, and a liquid crystal layer between the first substrate and the second substrate. The sealing member may seal the liquid crystal layer by surrounding it.

The liquid crystal display device may further include a first pixel electrode on the organic film and a second pixel electrode on the second substrate.

The thin film transistor portion may be electrically connected to the interconnection portion, and include a gate electrode, an active layer, a source electrode, and a drain electrode.

The capacitor portion may further include a second storage electrode including a same material as the source electrode and the drain electrode.

The first storage electrode and the ultraviolet light blocking portion may each include at least one selected from the group consisting of indium tin oxide (ITO), indium zinc oxide (IZO), zinc oxide (ZnO), indium oxide (In$_2$O$_3$), indium gallium oxide (IGO), and aluminum zinc oxide (AZO).

According to yet another exemplary embodiment of the present invention, a method of manufacturing a liquid crystal display device is provided. The method includes: forming an interconnection portion and a gate electrode on a first substrate; forming an ultraviolet light blocking portion adjacent to both sides of the interconnection portion, and a first storage electrode on the first substrate, including forming a light transmissive electrode layer on the first substrate, and patterning the light transmissive electrode layer; forming a gate insulating layer on the interconnection portion, the ultraviolet light blocking portion, the gate electrode, and the first storage electrode; forming an active layer on the gate insulating layer; forming a source electrode and a drain electrode on the active layer, and a second storage electrode on the first storage electrode, including forming a metal layer on the active layer and the gate insulating layer, and patterning the metal layer; forming an organic film on the gate insulating layer, the source electrode, the drain electrode, and the second storage electrode; sealing the first substrate to a second substrate opposing the first substrate using a sealing member in a location that overlaps the interconnection portion between the organic film and the second substrate; and radiating ultraviolet light through the first substrate toward the second substrate and on the sealing member.

The patterning of the light transmissive electrode layer may include using a half tone mask.

The patterning of the light transmissive electrode layer may further include plasma processing the ultraviolet light blocking portion.

The ultraviolet light blocking portion may have a haze value larger than that of the first storage electrode.

The method may further include injecting a liquid crystal layer between the first substrate and the second substrate.

The method may further include forming via holes in the organic film corresponding to the drain electrode and the second storage electrode, and forming a first pixel electrode on the organic film to connect to the drain electrode and the second storage electrode through the via holes.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, embodiments of the present invention are described more fully with reference to the accompanying drawings, in which exemplary embodiments are shown. As used herein, the term "and/or" includes any combinations of one or more of the associated listed items. Expressions such as "at least one of," when preceding a list of elements, modify the entire list of elements as opposed to the individual elements of the list. The present invention encompasses numerous embodiments that allow for various changes as would be apparent to one of ordinary skill in the art. Particular embodiments are illustrated in the drawings and described in detail in the written description. However, this is not intended to limit the present invention to particular modes of practice. It is appreciated that all changes, equivalents, and substitutes that do not depart from the spirit and technical scope of the present invention are encompassed in the present invention. In the description of embodiments of the present invention, certain detailed explanations of related art may be omitted when they may unnecessarily obscure aspects more relevant to the invention.

While such terms as "first," "second," etc., may be used to describe various components, such components are not limited by the above terms. The above terms are used only to distinguish one component from another. The terms used in the present specification are used to describe particular embodiments, and are not intended to limit the present invention. An expression used in the singular encompasses the expression of the plural, unless it has a clearly different meaning in the context. In the present specification, it is understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Figure 1:
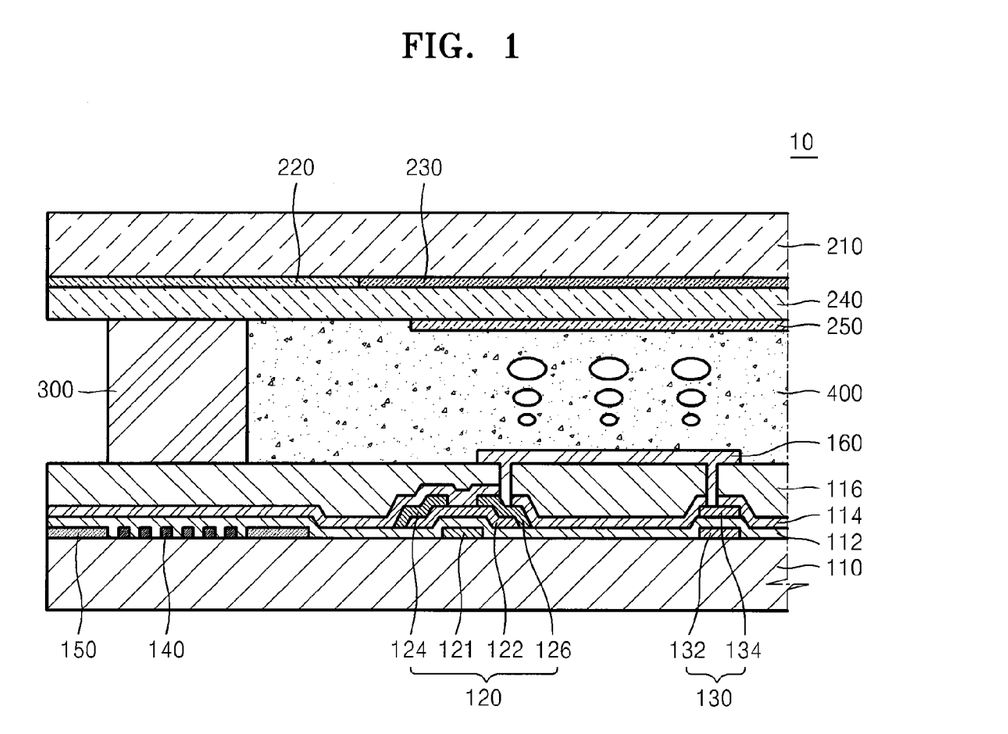
FIG. 1 is a cross-sectional view schematically illustrating a liquid crystal display device according to an embodiment of the present invention.

FIG. 1 is a cross-sectional view schematically illustrating a liquid crystal display device 10 according to an embodiment of the present invention.

Referring to FIG. 1, the liquid crystal display device 10 includes a first substrate 110 and a second substrate 210, which oppose each other, and a liquid crystal layer 400 and a sealing member 300, which are located between the first substrate 110 and the second substrate 210. In addition, as shown in the exemplary embodiment of FIG. 1, a thin film transistor portion 120, a capacitor portion 130, an interconnection portion 140, and an ultraviolet light blocking portion 150 are formed on the first substrate 110, while black matrix 220 and a color filter 230 are formed on the second substrate 210.

The first substrate 110 may be formed, for example of a transparent material. For instance, the first substrate 110 may be formed of transparent glass including $SiO_2$ or transparent plastic.

The thin film transistor portion 120 includes a gate electrode 121, an active layer 122, a source electrode 124, and a drain electrode 126. In more detail, the gate electrode 121 is formed with a set pattern (for example, a predetermined pattern) on the first substrate 110, the gate insulating layer 112 is formed on the gate electrode 121, and the active layer 122 (for example, a semiconductor layer) is formed with a set pattern (for example, a predetermined pattern) on the gate insulating layer 112. The source electrode 124 and the drain electrode 126 are formed on the active layer 122.

The gate electrode 121 may include at least one metal selected from aluminum (Al), silver (Ag), neodymium (Nd), chrome (Cr), titanium (Ti), tantalum (Ta), molybdenum (Mo), or the like. In addition, the gate electrode 121 may have a single layer structure or a multilayer structure in which a plurality of metal layers are stacked. The gate electrode 121 having a multilayer structure may be formed of a double layer that includes a metal layer such as Cr, Ti, Ta, Mo, or the like, and a low resistance metal layer such as Al or Ag.

The gate insulating layer 112 is an insulator formed, for example, on the whole surface of the first substrate 110 (for example, the gate insulating layer 112 may extend to cover the interconnection portion 140 and the ultraviolet light blocking portion 150). The gate insulating layer 112 may have a single layer or multilayer structure and may be formed of organic matter, inorganic matter, or a compound of organic and inorganic matter. For example, the gate insulating layer 112 may be formed of silicon nitride (SiNx) or silicon oxide (SiOx). However, the present invention is not limited thereto, and in other embodiments, different materials may be used for the gate insulating layer 112.

The active layer 122 may be formed of an inorganic semiconductor, such as amorphous silicon or polysilicon, or an organic semiconductor. The active layer 122 has regions (for example, source and drain regions), in which a source electrode 124 and a drain electrode 126 are formed, and a channel region between the regions. In addition, an ohmic contact layer may be further formed between the active layer 122 and the source electrode 124, and between the active layer 122 and the drain electrode 126.

The capacitor portion 130 includes a first storage electrode 132 and a second storage electrode 134. In addition, the gate insulating layer 112 extends onto the first storage electrode 132. Accordingly, the capacitor portion 130 includes the gate insulating layer 112 as a dielectric layer between the first storage electrode 132 and the second storage electrode 134.

The first storage electrode 132 may be formed of a light transmissive material. For example, the first storage electrode 132 may be formed of at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). Accordingly, an aperture ratio of the liquid crystal display device 10 may be improved. In addition, the second storage electrode 134 may be formed of the same material (for example, as part of the same layer) as the source electrode 124 and drain electrode 126.

As shown in the exemplary embodiment of FIG. 1, a protection layer 114 and an organic film 116, which include via holes (for example, via holes connecting to the drain electrode 126 and to the second storage electrode 134), are formed on the source electrode 124, the drain electrode 126, and the second storage electrode 134. The protection layer 114 and the organic film 116 are formed over the whole surface of the first substrate 110 (for example, the protection layer 114 may extend to cover the interconnection portion 140 and the ultraviolet light blocking portion 150). In other embodiments, the protection layer 114 may not be formed.

A first pixel electrode 160 is formed on the organic film 116. The first pixel electrode 160 is connected to the drain electrode 126 of the thin film transistor portion 120 and the second storage electrode 134 of the capacitor portion 130 through their respective via holes penetrating the organic film 116. The first pixel electrode 160 may be formed, for example, of ITO, IZO, ZnO, $In_2O_3$, or the like, which have high work function.

The interconnection portion 140 includes a plurality of interconnection lines spaced apart from each other. The interconnection portion 140 may be electrically connected to an electrode of the thin film transistor portion 120, such as the gate electrode 121 or the source electrode 124. In addition, the interconnection portion 140 may be formed of the same material (for example, in the same layer) as the gate electrode 121.

The ultraviolet light blocking portion 150 is formed parallel (for example, adjacent) to the interconnection portion 140 on both sides of the interconnection portion 140. In addition, the ultraviolet light blocking portion 150 may be formed of the same material (for example, in the same layer) as the first storage electrode 132. That is, the ultraviolet light blocking portion 150 may be formed of at least one selected from the group consisting of ITO, IZO, ZnO, $In_2O_3$, IGO, and AZO. In this case, the ultraviolet light blocking portion 150 may have a haze value (for example, turbidity or cloudiness, as measured by the percentage of light that is deflected or attenuated) that is larger than that of the first storage electrode 132 (for example, by subjecting the ultraviolet light blocking portion 150 to plasma processing). The gate insulating layer 112, the protection layer 114, and the organic film 116 may be formed on the interconnection portion 140 and the ultraviolet light blocking portion 150.

The second substrate 210, like the first substrate 110, may be formed of a transparent material. In the exemplary embodiment of FIG. 1, the black matrix 220 and the color filter 230 are formed on the second substrate 210. The black matrix 220 reduces or prevents effects such as compound colors or other interference of visible light that passes through the color filter 230. The color filter 230 gives color to light radiated from a light source and that passes through the liquid crystal layer 400. To this end, the color filter 230 may be formed of a photosensitive organic material.

In the exemplary embodiment of FIG. 1, an overcoat layer 240 for protecting the black matrix 220 and the color filter 230 is formed on the black matrix 220 and the color filter 230. In addition, a second pixel electrode 250 is formed on the overcoat layer 240 and patterned, for example, to correspond to a surface of the color filter 230. The second pixel electrode 250 may be formed of ITO, IZO, or the like. In a patterned vertical alignment (PVA) mode for forming an incision pattern in the second pixel electrode 250, processes, such as coating photosensitive film, developing the photosensitive film, and the like, are subsequently performed to form an incision pattern in the second pixel electrode 250 after forming the second pixel electrode 250. The overcoat layer 240 protects the color filter 230 during these processes.

The liquid crystal layer 400 is disposed between the first substrate 110 and the second substrate 210. In more detail, the liquid crystal layer 400 is interposed (for example, injected) between the first pixel electrode 160 and the second pixel electrode 250. As a voltage is applied to the first pixel electrode 160 and the second pixel electrode 250, the orientation of liquid crystal in the liquid crystal layer 400 is adjusted and thus, visible light supplied from a light source is blocked or passed. Light that passes obtains a color from passing through the color filter 230, thereby displaying an image.

The sealing member 300 is formed at the outer wall of the liquid crystal layer 400 (for example, surrounding the liquid crystal layer 400), and joins the first substrate 110 to the second substrate 210 (for example, for sealing the first substrate 110 to the second substrate 210). In more detail, the sealing member 300 is formed on the organic film 116 and seals the liquid crystal layer 400 by surrounding it between the first substrate 110 and the second substrate 210. The sealing member 300 may be an ultraviolet light hardened resin. In addition, the sealing member 300 may be formed in a location that overlaps (for example, coincides with) the interconnection portion 140 (as shown in FIG. 1). Accordingly, a larger screen may be obtained by lessening or minimizing a non-pixel region covering the black matrix 220.

As described above, since the ultraviolet light blocking portion 150 is disposed at both edge portions (for example, sides) of the interconnection portion 140 and the sealing member 300 is formed in a location that overlaps (for example, coincides with) the interconnection portion 140, the ultraviolet light blocking portion 150 may be formed at the outer wall of the sealing member 300 and/or inner wall of the sealing member 300 at a region (for example, an overlap region) in which the first substrate 110 and the sealing member 300 overlap each other (for example, adjacent to and outside of the outer wall and/or inside of the inner wall of the sealing member 300). Thus, as described below, when radiating ultraviolet light from the first substrate 110 toward the second substrate 210 to form (for example, harden) the sealing member 300, it is possible to lessen or minimize the organic film 116 adjacent to the sealing member 300 from being exposed to the ultraviolet light. Accordingly, defects in the organic film 116, which occur as a contiguous structure of the organic film 116 is broken by the ultraviolet light, may be minimized. In addition, since the defects of the organic film 116 are reduced or minimized, the permeation of moisture into the liquid crystal display device 10 that results from such defects is also reduced or minimized. Accordingly, the occurrence of stains on a screen may be reduced or prevented.

FIGS. 2 through 9 are cross-section view sequentially illustrating a method of manufacturing the liquid crystal display device 10 of FIG. 1 according to an embodiment of the present invention. The method is described with reference to FIGS. 2 through 9.

Figure 2:
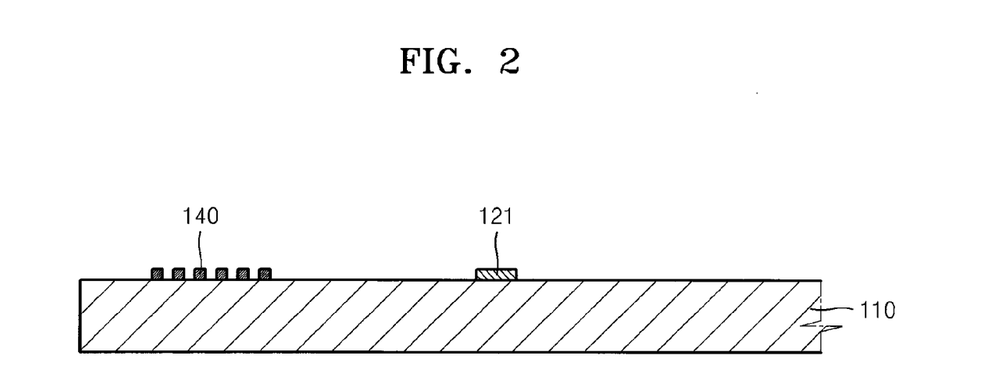
FIGS. 2 through 9 are cross-sectional views sequentially illustrating a method of manufacturing the liquid crystal display device of FIG. 1 according to an embodiment of the present invention.
Figure 9:
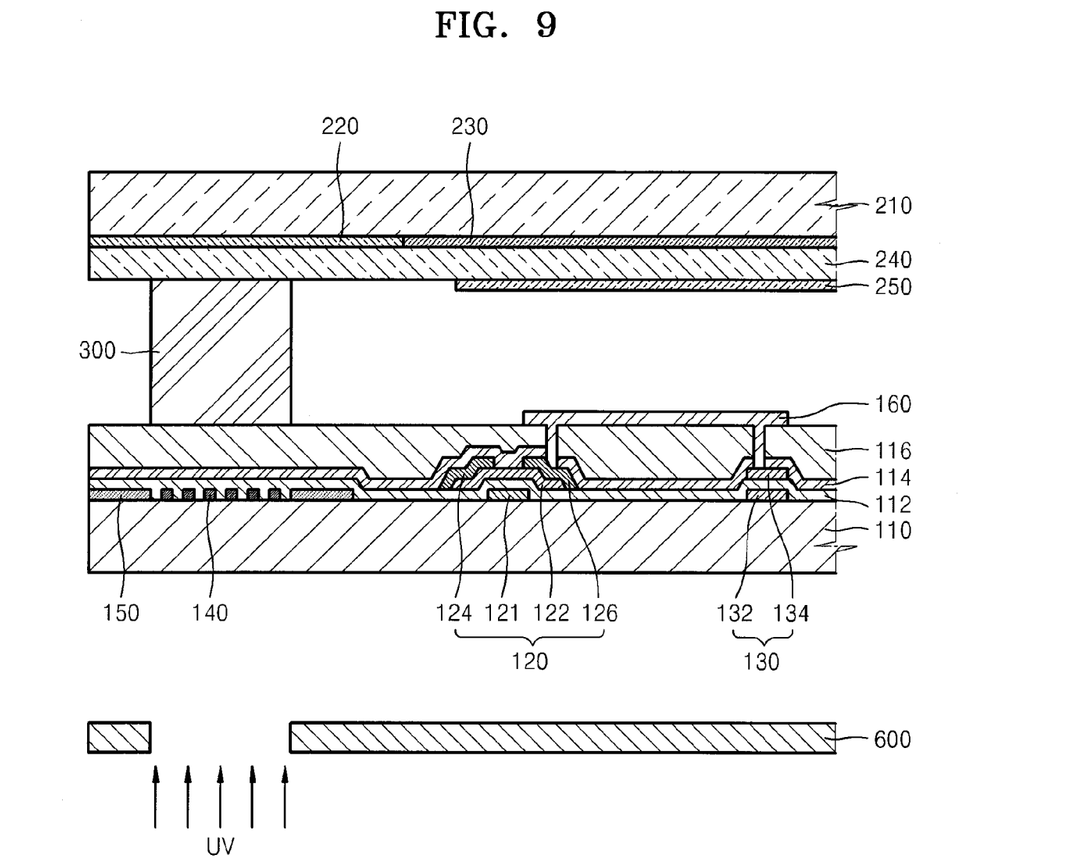

A first substrate 110 of FIG. 2 and a second substrate 210 of FIG. 9 are prepared. Black matrix 220, a color filter 230, an overcoat layer 240, and a second pixel electrode 250 are formed on the second substrate 210 of FIG. 9.

Next, as shown in FIG. 2, an interconnection portion 140 and a gate electrode 121 are formed on the first substrate 110. The first substrate 110 may be formed of a transparent glass material having $SiO_2$ as a main component. In addition, a buffer layer that includes $SiO_2$ and/or SiNx may be further formed on the first substrate 110 to make the first substrate 110 be planar (or more planar) and to block the infiltration of impure elements. After forming a metal layer including at least one of Al, Ag, Nd, Cr, Ti, Ta, Mo, or the like on the first substrate 110, the interconnection portion 140 and the gate electrode 121 may be formed, for example, by patterning the metal layer. The patterning of the metal layer may be performed through a series of processes, such as exposing, developing, etching, stripping, and ashing, by coating a photoresist layer on the formed metal layer and then locating a mask, which has openings corresponding to positions in which the interconnection portion 140 and the gate electrode 121 are formed, on the photoresist layer.

Figure 3:
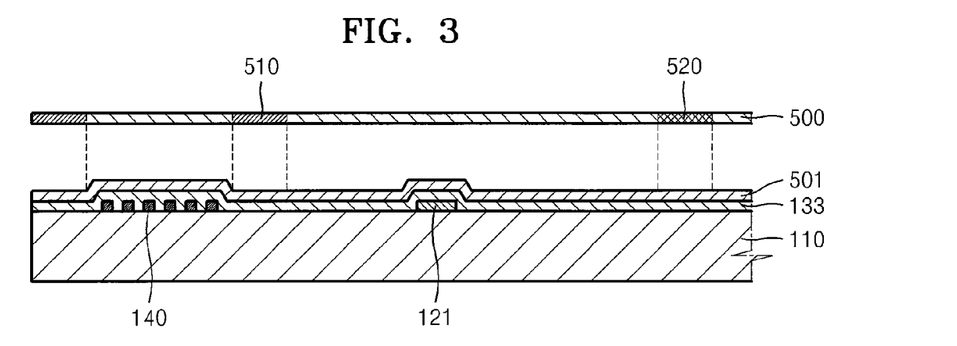

After the interconnection portion 140 and the gate electrode 121 have been formed, as illustrated in FIG. 3, a photomask process is performed after forming a light transmissive electrode layer 133 on the whole surface of the first substrate 110. In more detail, an exposing process is performed after forming a photoresist layer 501 on the light transmissive electrode layer 133 and then locating a mask 500. In this case, the mask 500 is a half tone mask, and includes a first light blocking portion 510 corresponding to where an ultraviolet light blocking portion 150 is formed and a second light blocking portion 520 corresponding to where a first storage electrode 132 is formed. For example, the first light blocking portion 510 may be a semi-transmissive portion that half blocks light, the second light blocking portion 520 may be a light blocking portion that all blocks light, and the other region may be a light transmissive portion.

Accordingly, during the exposing process, exposing of the photoresist layer 501 is performed to different degrees where the ultraviolet light blocking portion 150 is formed and where the first storage electrode 132 is formed. In the subsequent etching process, a portion of the photoresist layer 501 formed on the first storage electrode 132 remains intact, and a portion of the photoresist layer 501 formed on the light transmissive electrode layer 133 where the ultraviolet light blocking portion 150 is formed remains with about half of the thickness thereof. Subsequently, when the light transmissive electrode layer 133 is exposed by etching and removing enough of the photoresist layer 501 to expose the light transmissive electrode layer 133 where the ultraviolet light blocking portion 150 is formed, a portion (for example, half) of the photoresist layer 501 formed on the first storage electrode 132 remains as illustrated in FIG. 4.

Figure 4:
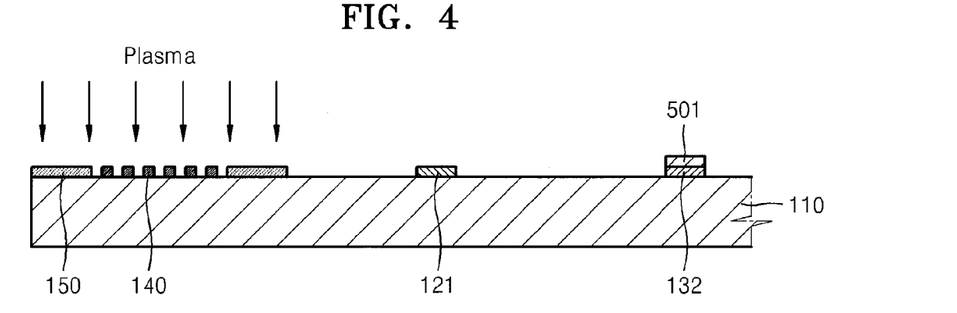

Next, the ultraviolet light blocking portion 150 is formed by plasma-processing (for providing a hazed property) with respect to the exposed light transmissive electrode layer 133 exposed as shown in FIG. 4. In this case, as described above, the first storage electrode 132 may be protected from applied plasma since the first storage electrode 132 is protected by the remaining photoresist layer 501. Although $SiH_4$ gas, $N_2$ gas, or the like may be used for plasma, the present invention is not limited thereto. In other embodiments, a commonly known plasma surface treatment technology may be used. When plasma is applied to the light transmissive electrode layer 133, the surface of the light transmissive electrode layer 133 is etched and thus, the light transmissivity thereof may be reduced.

Figure 5:
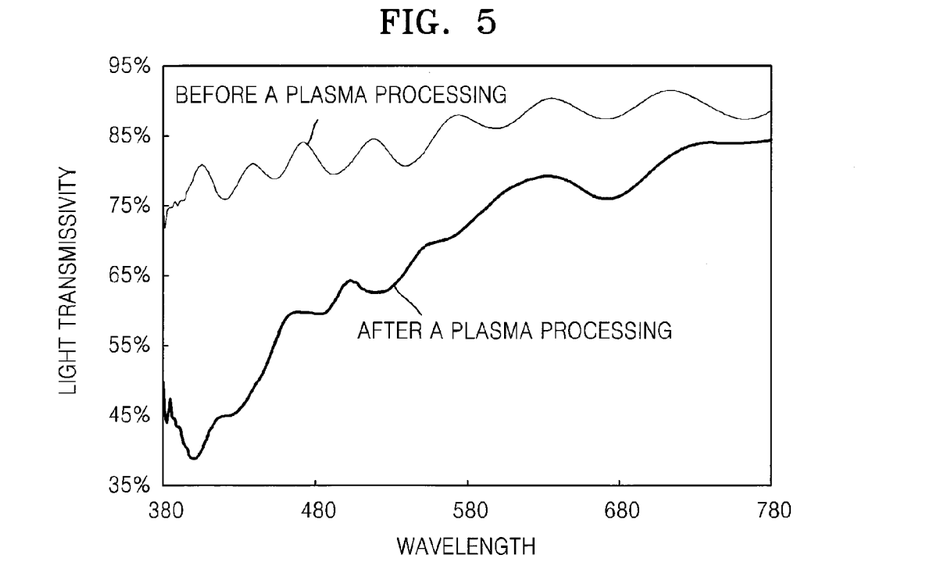

FIG. 5 is a graph illustrating the light transmissivity (%) by wavelength (nm) of the light transmissive electrode layer 133 before performing plasma processing and the light transmissivity of the light transmissive electrode layer 133 after performing plasma processing. Referring to FIG. 5, after performing the plasma processing, the shorter the wavelength of light becomes (for example, ultraviolet light, such as below 400 nm), the lower the light transmissivity becomes. Accordingly, as described below, when radiating ultraviolet light to harden the sealing member 300 of FIG. 9, the light transmissive electrode layer 133 reduces or prevents the passing of ultraviolet radiation to the organic film 116 adjacent to the sealing member 300, thereby lessening or preventing the organic film 116 from being damaged by the ultraviolet light. The ultraviolet light blocking portion 150 may be formed in parallel (for example, adjacent to and on the first substrate 110) with the interconnection portion 140 at both sides of the interconnection portion 140.

Figure 6:
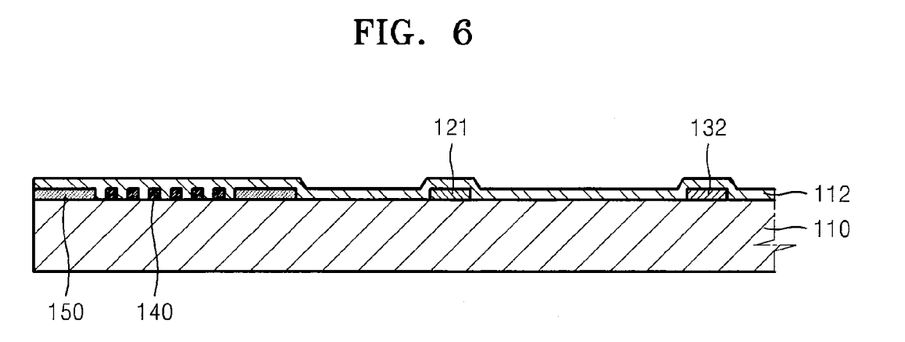

Next, as illustrated in FIG. 6, a gate insulating layer 112 is formed on the interconnection portion 140, the ultraviolet light blocking portion 150, the gate electrode 121, and the first storage electrode 132. The gate insulating layer 112 may include a single layer or a plurality of layers, formed of $SiO_2$, SiNx, or the like, and may function as a dielectric layer of a capacitor portion 130 since it is formed on the whole surface of the first substrate 110.

Figure 7:
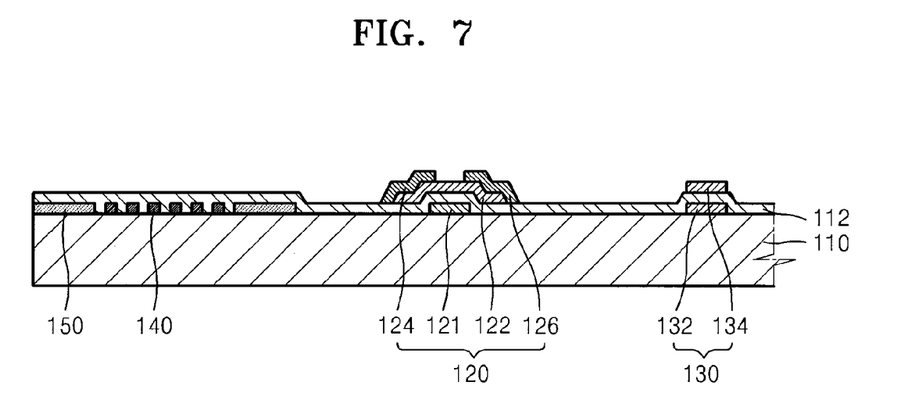

As illustrated in FIG. 7, an active layer 122 is formed on the gate insulating layer 112 after forming the gate insulating layer 112. Next, a thin film transistor portion 120 is formed by forming a source electrode 124 and a drain electrode 126 on the active layer 122, and the capacitor portion 130 is formed by forming a second storage electrode 134 together with the source electrode 124 and the drain electrode 126.

The active layer 122 may be formed, for example, of amorphous silicon or poly silicon. In this case, poly silicon may be formed by crystallizing amorphous silicon. A method of crystallizing amorphous silicon may include various methods, such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or the like. The active layer 122 may be deposited by using various deposition methods, such as a plasma enhanced chemical vapor deposition (PECVD) method, an atmospheric pressure CVD (APCVD) method, a low pressure CVD (LPCVD) method, or the like. After depositing the active layer 122, a region (for example, a source region) connected to the source electrode 124 and a region (for example, a drain region) connected to the drain electrode 126 are doped with impurities. As a result, the active layer 122 includes regions (e.g., source and drain regions) doped with ion impurities and a channel region between the regions.

The source electrode 124, the drain electrode 126, and the second storage electrode 134 may be formed by etching the same metal layer through a mask process. Accordingly, the second storage electrode 134 is formed of the same material as the source electrode 124 and the drain electrode 126. The metal layer, which is used for forming the source electrode 124, the drain electrode 126, and the second storage electrode 134, may include one or more metals selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

Figure 8:
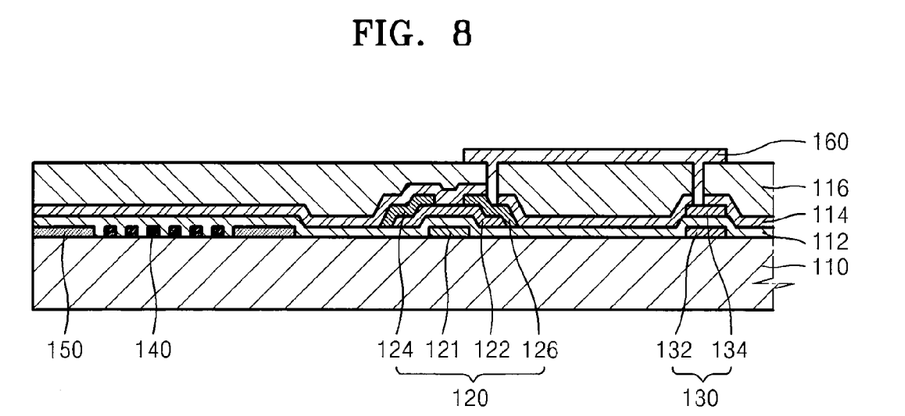

Next, as illustrated in FIG. 8, after forming a protection layer 114 and an organic film 116 over the whole surface of the first substrate 110, a first pixel electrode 160 is formed on the organic film 116. Via holes are formed in the protection layer 114 and the organic film 116 to expose portions of the drain electrode 126 and the second storage electrode 134, and the first pixel electrode 160 is formed filling the via holes, such that the first pixel electrode 160 is connected to the drain electrode 126 and the second storage electrode 134.

Subsequently, as illustrated in FIG. 9, ultraviolet light is radiated after forming the sealing member 300 between the first substrate 110 and the second substrate 210. The sealing member 300 is formed in a location that overlaps (for example, coincides with) the interconnection portion 140. When the sealing member 300 is formed to overlap the interconnection portion 140, a non-pixel region covered with the black matrix 220 is reduced and thus, a larger screen (for example, a larger viewing area with the same size substrates) may be obtained.

Ultraviolet light is radiated from the first substrate 110 (for example, from an outside surface of the first substrate 110 toward an inside surface of the first substrate 110) toward the second substrate 210, and a mask 600 is used to prevent ultraviolet light from being radiated on the thin film transistor portion 120 and the capacitor portion 130 during the radiation of the ultraviolet light. In the mask 600, an opening through which ultraviolet light may pass is formed corresponding to a location of the sealing member 300. Accordingly, ultraviolet light may be radiated on only a portion in which the sealing member 300 has been formed. However, it is difficult to match equally the width of the opening formed in the mask 600 with the width of the sealing member 300 when considering errors in process. Thus, to uniformly harden the sealing member 300, the width of the opening formed in the mask 600 is formed larger than that of the sealing member 300. As a result, ultraviolet light radiated to harden the sealing member 300 may be radiated also on the organic film 116 located around the sealing member 300 and thus, the organic film 116 may be damaged by the ultraviolet light.

According to embodiments of the present invention, since the ultraviolet light blocking portion 150 is formed at the outer wall of a region in which the first substrate 110 and the sealing member 300 overlap each other, it is possible to reduce or prevent ultraviolet light from being radiated on the organic film 116 located around the sealing member 300. Accordingly, it is possible to reduce prevent stains from being generated on a screen by reducing or preventing moisture infiltration due to damage of the organic film 116.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A liquid crystal display device comprising:
a first substrate extending in a horizontal direction;
a second substrate opposing the first substrate in a vertical direction;
an organic film between the first substrate and the second substrate;
a liquid crystal layer between the organic film and the second substrate;
a sealing member between the organic film and the second substrate, surrounding and sealing the liquid crystal layer between the organic film and the second substrate, and having an inner wall adjacent to the liquid crystal layer to define an inside of the liquid crystal display device and an outer wall on an opposite side of the inner wall to define an outside of the liquid crystal display device;
an inside ultraviolet light blocking member between the first substrate and the organic film, and adjacent to the inner wall of the sealing member in the vertical direction and extending toward the inside of the liquid crystal display device;
an outside ultraviolet light blocking member between the first substrate and the organic film, and adjacent to the outer wall of the sealing member in the vertical direction and extending toward the outside of the liquid crystal display device;
a thin film transistor portion between the first substrate and the organic film;
a plurality of interconnection lines between the first substrate and the organic film and overlapping with the sealing member in the vertical direction, between the inside ultraviolet light blocking member and the outside ultraviolet light blocking member in the horizontal direction, and electrically connected to the thin film transistor portion; and
a capacitor portion on the first substrate, wherein the capacitor portion comprises a first storage electrode comprising a light transmissive electrode layer formed from a same layer as the inside ultraviolet light blocking member and the outside ultraviolet light blocking member,
wherein the inside ultraviolet light blocking member and the outside ultraviolet light blocking member comprise a same material as the first storage electrode, and
wherein the inside ultraviolet light blocking member and the outside ultraviolet light blocking member have a haze value larger than that of the first storage electrode.

2. The liquid crystal display device of claim 1, wherein the thin film transistor portion comprises:
a gate electrode comprising a same material and formed from a same layer as the plurality of interconnection lines;
a gate insulating layer on the gate electrode;
an active layer on the gate insulating layer; and
a source electrode and a drain electrode connected to the active layer.

3. The liquid crystal display device of claim 2, wherein the gate insulating layer extends onto the first storage electrode,
the capacitor portion further comprises a second storage electrode on the gate insulating layer, and the second storage electrode comprises a same material as the source electrode and the drain electrode.

4. The liquid crystal display device of claim 3, further comprising a first pixel electrode on the organic film, the first pixel electrode being connected to the drain electrode and the second storage electrode through via holes in the organic film.

5. The liquid crystal display device of claim 2, further comprising a protection layer on the source electrode and the drain electrode, the gate insulating layer and the protection layer extending to cover the plurality of interconnection lines, the inside ultraviolet light blocking member, and the outside ultraviolet light blocking member.

6. A liquid crystal display device comprising:
a first substrate;
an interconnection portion, an ultraviolet light blocking portion, a thin film transistor portion, and a capacitor portion on the first substrate;
an organic film on the first substrate and covering the interconnection portion, the ultraviolet light blocking portion, the thin film transistor portion, and the capacitor portion; and
a sealing member on the organic film,
wherein
the capacitor portion comprises a first storage electrode comprising a light transmissive material formed from a same layer as the ultraviolet light blocking portion, and
the ultraviolet light blocking portion comprises a same material as the first storage electrode and is adjacent to and outside of an overlap region of the first substrate and an outer wall of the sealing member.

7. The liquid crystal display device of claim 6, wherein the ultraviolet light blocking portion is adjacent to both sides of the interconnection portion, and
the interconnection portion overlaps the sealing member.

8. The liquid crystal display device of claim 6, wherein the ultraviolet light blocking portion has a haze value larger than that of the first storage electrode.

9. The liquid crystal display device of claim 6, further comprising:
a second substrate opposing the first substrate; and
a liquid crystal layer between the first substrate and the second substrate,
wherein the sealing member seals the liquid crystal layer by surrounding it.

10. The liquid crystal display device of claim 9, further comprising a first pixel electrode on the organic film and a second pixel electrode on the second substrate.

11. The liquid crystal display device of claim 6, wherein the thin film transistor portion
is electrically connected to the interconnection portion, and
comprises a gate electrode, an active layer, a source electrode, and a drain electrode.

12. The liquid crystal display device of claim 11, wherein the capacitor portion further comprises a second storage electrode comprising a same material as the source electrode and the drain electrode.

13. The liquid crystal display device of claim 6, wherein the first storage electrode and the ultraviolet light blocking portion each comprise at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

14. A method of manufacturing a liquid crystal display device, the method comprising:
forming an interconnection portion and a gate electrode on a first substrate;
forming an ultraviolet light blocking portion adjacent to both sides of the interconnection portion, and a first storage electrode on the first substrate, comprising:
forming a light transmissive electrode layer on the first substrate; and
patterning the light transmissive electrode layer;
forming a gate insulating layer on the interconnection portion, the ultraviolet light blocking portion, the gate electrode, and the first storage electrode;
forming an active layer on the gate insulating layer;
forming a source electrode and a drain electrode on the active layer, and a second storage electrode on the first storage electrode, comprising:
forming a metal layer on the active layer and the gate insulating layer; and
patterning the metal layer;
forming an organic film on the gate insulating layer, the source electrode, the drain electrode, and the second storage electrode;
sealing the first substrate to a second substrate opposing the first substrate using a sealing member in a location that overlaps the interconnection portion between the organic film and the second substrate; and
radiating ultraviolet light through the first substrate toward the second substrate and on the sealing member.

15. The method of claim 14, wherein the patterning of the light transmissive electrode layer comprises using a half tone mask.

16. The method of claim 15, wherein the patterning of the light transmissive electrode layer further comprises plasma processing the ultraviolet light blocking portion.

17. The method of claim 15, wherein the ultraviolet light blocking portion has a haze value larger than that of the first storage electrode.

18. The method of claim 14, further comprising injecting a liquid crystal layer between the first substrate and the second substrate.

19. The method of claim 14, further comprising:
forming via holes in the organic film corresponding to the drain electrode and the second storage electrode; and
forming a first pixel electrode on the organic film to connect to the drain electrode and the second storage electrode through the via holes.

* * * * *